United States Patent
Lee et al.

(10) Patent No.: US 8,278,672 B2
(45) Date of Patent: Oct. 2, 2012

(54) SEMICONDUCTOR LIGHT-EMITTING DEVICE AND FABRICATION METHOD THEREOF

(75) Inventors: Ya-Ju Lee, Hsinchu (TW); Ta-Cheng Hsu, Hsinchu (TW); Ming-Ta Chin, Hsinchu (TW); Yen-Wen Chen, Hsinchu (TW); Wu-Tsung Lo, Hsinchu (TW); Chung-Yuan Li, Hsinchu (TW); Min-Hsun Hsieh, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 1138 days.

(21) Appl. No.: 11/727,378

(22) Filed: Mar. 26, 2007

(65) Prior Publication Data

US 2007/0221929 A1    Sep. 27, 2007

(30) Foreign Application Priority Data

Mar. 27, 2006   (TW) .............................. 95110538 A

(51) Int. Cl.
*H01L 33/22* (2010.01)

(52) U.S. Cl. .......... 257/95; 257/103; 257/627; 257/628; 257/E33.003; 257/E33.005; 257/E33.006; 438/964; 438/973; 117/101

(58) Field of Classification Search ............ 257/79–103, 257/9–39, 183–201, 613–616, 618–628, 257/E33.003, E33.005, E33.006; 438/22–47, 438/964, 973; 117/63, 101, 902

See application file for complete search history.

(56) References Cited

U.S. PATENT DOCUMENTS

| | | | | | |
|---|---|---|---|---|---|
| 4,987,472 | A | * | 1/1991 | Endo et al. ................... | 148/33.4 |
| 5,530,713 | A | * | 6/1996 | Fukagai .................... | 372/45.011 |
| 5,569,954 | A | * | 10/1996 | Hata et al. ..................... | 257/627 |
| 5,843,227 | A | * | 12/1998 | Kimura et al. ................ | 117/101 |
| 5,923,054 | A | * | 7/1999 | Kobashi et al. ............... | 257/103 |
| 6,072,196 | A | * | 6/2000 | Sato ............................... | 257/87 |
| 7,579,205 | B2 | * | 8/2009 | Ikeda et al. .................... | 438/46 |
| 2002/0050601 | A1 | * | 5/2002 | Saeki et al. ................... | 257/103 |
| 2003/0178626 | A1 | * | 9/2003 | Sugiyama et al. ............. | 257/79 |
| 2006/0192212 | A1 | * | 8/2006 | Song et al. ..................... | 257/79 |
| 2006/0281283 | A1 | * | 12/2006 | Yoshida et al. ............... | 438/478 |
| 2007/0158661 | A1 | * | 7/2007 | Lu et al. ......................... | 257/79 |

* cited by examiner

*Primary Examiner* — Steven J Fulk
*Assistant Examiner* — Eric Ward
(74) *Attorney, Agent, or Firm* — Muncy, Geissler, Olds & Lowe, PLLC

(57) ABSTRACT

A semiconductor light-emitting device is disclosed. The semiconductor light-emitting device comprises a multilayer epitaxial structure disposed on a semiconductor substrate. The semiconductor substrate has a predetermined lattice direction perpendicular to an upper surface thereof, wherein the predetermined lattice direction is angled toward [0$\bar{1}$1] or [01$\bar{1}$] from [100], or toward [011] or [0$\bar{1}\bar{1}$] from [$\bar{1}$00] so that the upper surface of the semiconductor substrate comprises at least two lattice planes with different lattice plane directions. The multilayer epitaxial structure has a roughened upper surface perpendicular to the predetermined lattice direction. The invention also discloses a method for fabricating a semiconductor light-emitting device.

6 Claims, 5 Drawing Sheets

SEMICONDUCTOR LIGHT-EMITTING DEVICE AND FABRICATION METHOD THEREOF

BACKGROUND OF THE INVENTION

1. Technical Field

The invention relates to fabrication technology for a semiconductor light-emitting device, and more particularly to a semiconductor light-emitting device with increased light extraction efficiency and the fabrication method thereof.

2. Description of the Related Art

Semiconductor light-emitting devices, such as light-emitting diodes (LEDs), have been become popular due to the small size, light weight, and low power consumption along with the increased light-emitting efficiency. Typically, an LED comprises a semiconductor p-n diode. After a bias applies to both ends of the p-n junction for passing current therethrough, electrons and holes are combined to release light. To increase LED's reliability and lower its energy consumption, increased light-emitting efficiency thereof is required.

Light-emitting efficiency of LEDs is also known as external quantum efficiency of a device, which is the product of internal quantum efficiency and light extraction efficiency of the LED. The internal quantum efficiency of the LED is the electric-optical conversion efficiency thereof determined by material properties and quality. Additionally, the light extraction efficiency is determined by the structure, the light absorption index and refractive index of LEDs. Conventionally, the internal quantum efficiency is raised by improving the quality of epitaxial layers or changing the epitaxial structure, to suppress the electric energy converting to thermal energy. Nevertheless, to further increase the light-emitting efficiency of LEDs, another important concern is how to increase light extraction efficiency thereof.

It has been proposed to roughen the profile of an LED to increase the light reflection and scattering, thereby increasing light-emitting efficiency of the LED. For example, an LED with a roughened surface can be accomplished by natural lithography, such as ion beam etching using randomly arranged polystyrene spheroids as a mask, but it may result in uneven rough surface or damage the lattice structure of the active layer of the LED and thereby reducing the light extraction efficiency of the LED. Another method for surface roughening is wet etching. In this method, an epitaxial layer for light emission is grown on a substrate with unselected lattice plane. The surface of the epitaxial layer is etched by suitable etchant with a metal mask. Since wet etching is isotropic, the epitaxial layer is etched in not only a vertical direction but also horizontal direction, so the patterns on the mask cannot effectively transfer to the surface of the epitaxial layer and thereby reducing the degree of roughening. Moreover, both ion beam etching and wet etching require an additional process step for formation of an etch mask and the process steps of both are complicated.

The surface roughening degree is proportioned to light extraction efficiency. Therefore, there is a need to develop an improved fabrication method for a semiconductor light-emitting device with higher degree of surface roughening and thereby increasing light extraction efficiency.

BRIEF SUMMARY OF THE INVENTION

A detailed description is given in the following embodiments with reference to the accompanying drawings. An embodiment of a semiconductor light-emitting device and a fabrication method thereof are provided. The semiconductor light-emitting device comprises a multilayer epitaxial structure disposed on a semiconductor substrate. The semiconductor substrate has a predetermined lattice direction perpendicular to an upper surface thereof, wherein the predetermined lattice direction is oriented toward [0$\bar{1}$1] or [01$\bar{1}$] from [100] with a first angle, or oriented toward [011] or [0$\bar{1}\bar{1}$] from [$\bar{1}$00] with a second angle, so the upper surface of the semiconductor substrate comprises at least two lattice planes with different lattice plane directions. A multilayer epitaxial structure disposed on the semiconductor substrate therefore has a roughened upper surface perpendicular to the predetermined lattice directions.

An embodiment of a method for fabricating a semiconductor light-emitting device comprises providing a semiconductor substrate having a predetermined lattice direction perpendicular to an upper surface thereof, wherein the predetermined lattice direction is oriented toward [0$\bar{1}$1] or [01$\bar{1}$] from [100] with a first angle, or oriented toward [011] or [0$\bar{1}\bar{1}$] from [$\bar{1}$00] with a second angle, so the upper surface of the semiconductor substrate comprises at least two lattice planes with different lattice plane directions. A multilayer epitaxial structure is formed on the semiconductor substrate. Surface roughening is performed on an upper surface of the multilayer epitaxial structure on the semiconductor substrate by etching.

BRIEF DESCRIPTION OF DRAWINGS

The invention can be more fully understood by reading the subsequent detailed description and examples with references made to the accompanying drawings, wherein.

DETAILED DESCRIPTION OF THE PREFERRED EMBODIMENTS

The following description is provided for the purpose of illustrating the general principles of the invention and should not be taken in a limiting sense. The scope of the invention is best determined by reference to the appended claims.

Figure 1A:
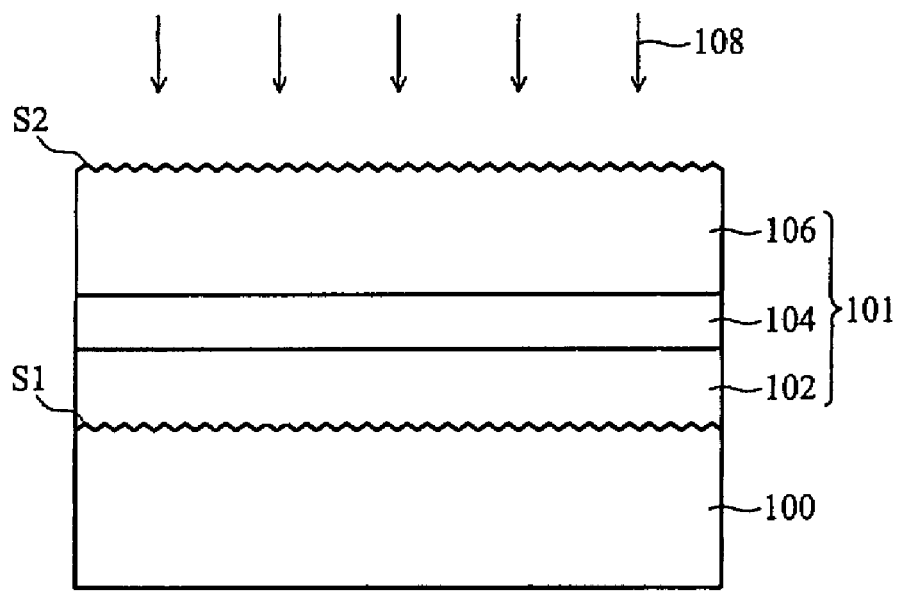
FIGS. 1A to 1B are cross sections of an embodiment of a method for fabricating a semiconductor light-emitting device.
Figure 1B:
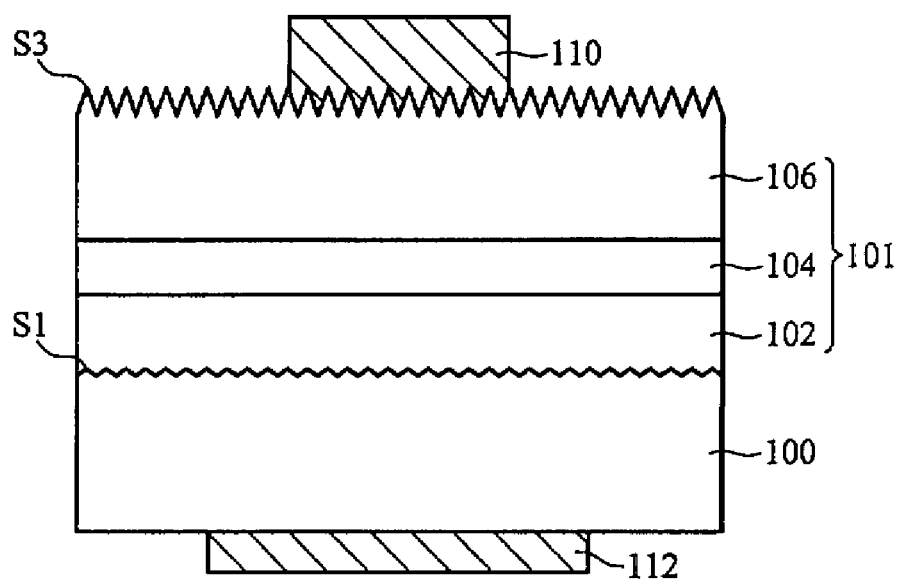

FIG. 1B illustrates an embodiment of a semiconductor light-emitting device. The semiconductor light-emitting device, such as a light-emitting diode (LED), comprises a semiconductor substrate 100, a multilayer epitaxial structure 101, and upper and lower electrode plates 110 and 112. In this embodiment, the semiconductor substrate 100 is provided for formation of the multilayer epitaxial structure 101, comprising a III-V group compound semiconductor material, such as GaAsP, GaAs, GaP or the like. The multilayer epitaxial structure 101 is disposed on the semiconductor substrate 100 and comprises an n-type semiconductor layer 102, a p-type semiconductor layer 106, and an active layer 104 interposed therebetween. In some embodiments, the arrangements of the n-type and p-type semiconductor layers 102 and 106 can be interchanged. That is, the p-type semiconductor layer 106 is disposed at the bottom of the multilayer epitaxial structure 101 and the n-type semiconductor layer 102 is disposed on the top of the multilayer epitaxial structure 101. In the embodiment, the n-type and p-type semiconductor layers 102 and 106 act as cladding layers of the LED, comprising III-V group compound semiconductor materials, such as AlGaInP, AlGaAs or other ternary or quaternary III-V group compound semiconductor materials. The active layer 104 may comprise $[Al_xGa_{1-x}]_{0.5}In_{0.5}P$ or other materials matched with the n-type and p-type semiconductor layers 102 and 106. The upper and lower electrode plates 110 and 112 are disposed on the top of the multilayer epitaxial structure 101 and the bottom of the semiconductor substrate 100 respectively.

Figure 2:
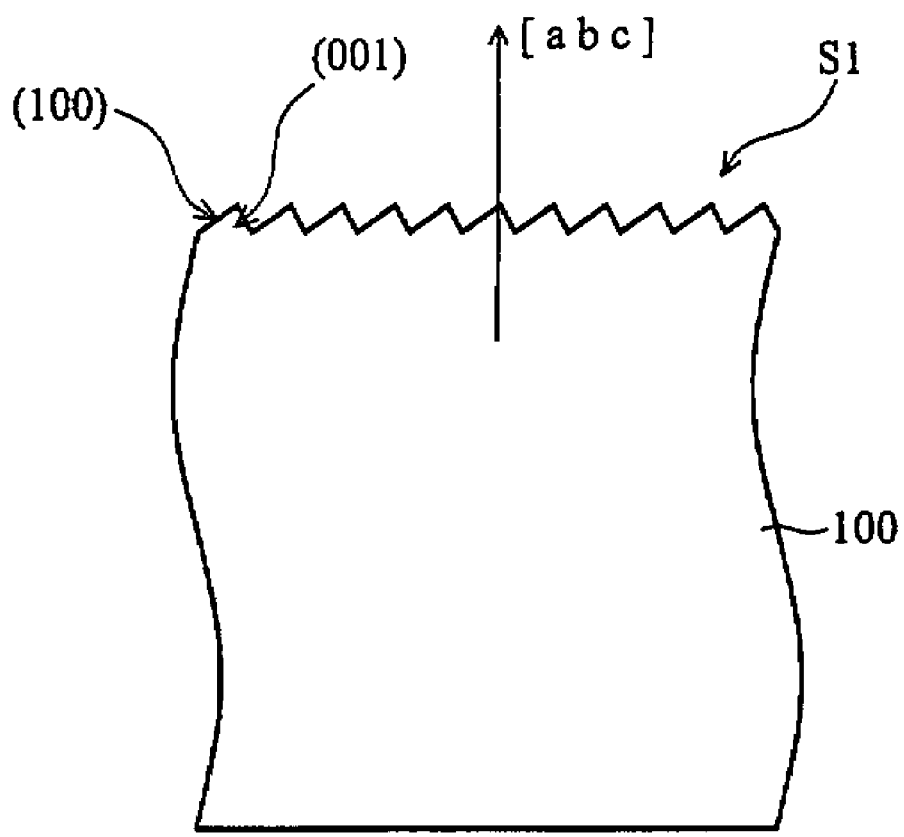
FIG. 2 is a magnified diagram showing a part of the semiconductor substrate shown in FIGS. 1A and 1B.

In particular, FIG. 2 illustrates a magnified diagram showing a part of semiconductor substrate shown in FIGS. 1A and 1B. The semiconductor substrate 100 has a predetermined lattice direction [abc] substantially perpendicular to an upper surface S1 thereof so the upper surface S1 of the semiconductor substrate 100 comprises at least two lattice planes, such as (100) and (001) lattice planes, to form an uneven rough surface. In this embodiment, the predetermined lattice direction [abc] is defined by having a group III atom located at the [000] position of the coordinate of the unit cell as the origin and then oriented toward [0$\bar{1}$1] or [01$\bar{1}$] with an angle from [100], wherein the angle is between 6° and 55°, and 15° is preferred. In some embodiments, the predetermined lattice direction [abc] may be oriented toward [011] or [0$\bar{1}\bar{1}$] with an angle from [$\bar{1}$00], wherein the angle is also between 6° and 55°, and 15° is preferred.

As shown in FIG. 1B, the multilayer epitaxial structure 101 also has the predetermined lattice direction [abc] substantially perpendicular to an upper surface S3 thereof so the upper surface S3 of the multilayer epitaxial structure 101 and the upper surface S1 of the semiconductor substrate 100 have substantially the same surface topography. However, the roughening degree of the upper surface S3 exceeds that of the upper surface S1 which will be described subsequently.

Figure 3A:
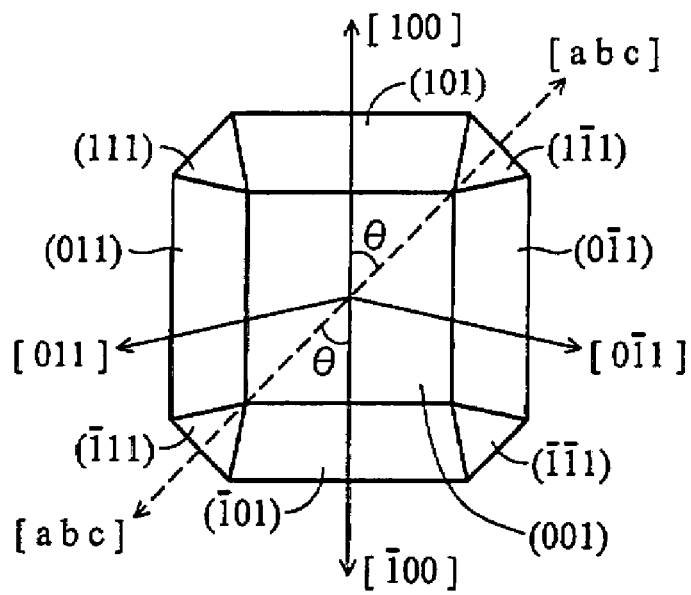
FIGS. 3A and 3B show several lattice planes of a cubic crystal lattice structure, respectively.

FIGS. 1A to 1B describe a method for fabricating a semiconductor light-emitting device. In FIG. 1A, a semiconductor substrate 100 is provided. The semiconductor substrate 100 has a predetermined lattice direction [abc] substantially perpendicular to an upper surface S1 thereof so the upper surface S1 of the semiconductor substrate 100 comprises at least two lattice planes, such as (100) and (001) lattice planes, to form an uneven rough surface, as shown in FIG. 2. FIG. 3A shows the diagram of the lattice planes of a cubic crystal structure. In the embodiment, the predetermined lattice direction [abc] of the semiconductor substrate 100 may be oriented toward [0$\bar{1}$1] with an angle θ from [100], or toward [011] with the angle θ from [$\bar{1}$00], wherein θ is between 6° and 55°, and 15° is preferred, as the dotted arrow labeled in FIG. 3A. The lattice planes and directions relative to the predetermined lattice direction [abc] are shown in FIG. 3A for clarification.

Figure 3B:
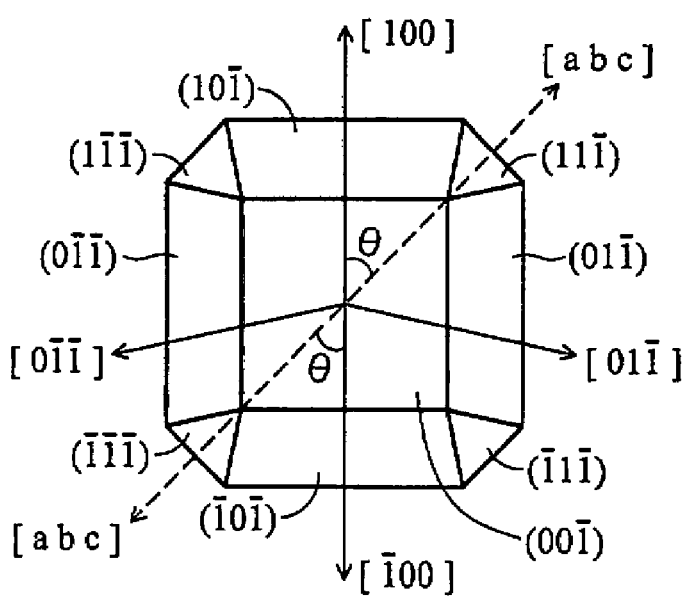

FIG. 3B shows the diagram of the lattice planes of a cubic crystal structure. In some embodiments, the predetermined lattice direction [abc] of the semiconductor substrate 100 may be oriented toward [01$\bar{1}$] with an angle θ from [100], or toward [0$\bar{1}\bar{1}$] with the angle θ from [$\bar{1}$00], wherein the angle θ is between 6° and 55°, and 15° is preferred, as the dotted arrow labeled in FIG. 3B. The lattice planes and directions relative to the predetermined lattice direction [abc] are also shown in FIG. 3B for clarification.

The semiconductor substrate 100 is provided for subsequent formation of a multilayer epitaxial structure 101, comprising an III-V group compound semiconductor material, such as GaAsP, GaAs, GaP or the like.

Next, a multilayer epitaxial structure 101 is formed on the semiconductor substrate 100, which having the predetermined lattice direction [abc], also has the predetermined lattice direction [abc] perpendicular to an upper surface S2 thereof by epitaxially grown on the substrate 100. That is, the upper surface S2 of the multilayer epitaxial structure 101 and the upper surface S1 of the semiconductor substrate 100 have substantially the same surface topography. In the embodiment, the multilayer epitaxial structure 101 can be formed by liquid phase epitaxy (LPE), metal organic vapor phase epitaxy (MOVPE), or other known epitaxial methods.

The multilayer epitaxial structure 101 may comprise an n-type semiconductor layer 102, a p-type semiconductor layer 106 and an active layer 104 interposed therebetween. In some embodiments, the p-type semiconductor layer 106 is disposed at the bottom of the multilayer epitaxial structure 101 and the n-type semiconductor layer 102 is disposed on the top of the multilayer epitaxial structure 101. In this embodiment, the n-type and p-type semiconductor layers 102 and 106 may comprise III-V group compound semiconductor materials, such as AlGaInP, AlGaAs or other ternary or quaternary III-V group compound semiconductor materials. The active layer 104 may comprise $[Al_xGa_{1-x}]_{0.5}In_{0.5}P$ or other materials matched for the n-type and p-type semiconductor layers 102 and 106.

Figure 1C:
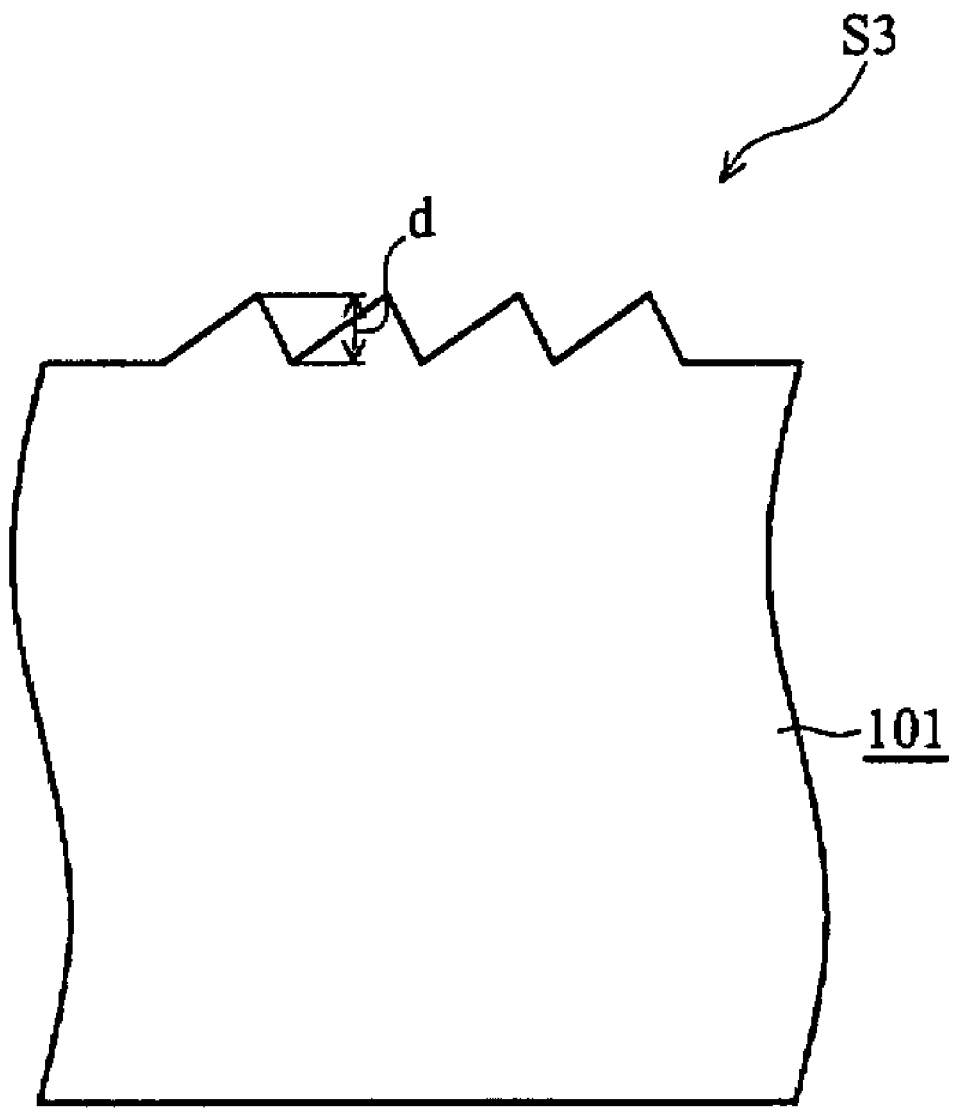
FIG. 1C is a magnified diagram showing a multilayer epitaxial structure of FIG. 1B.
Figure 1D:
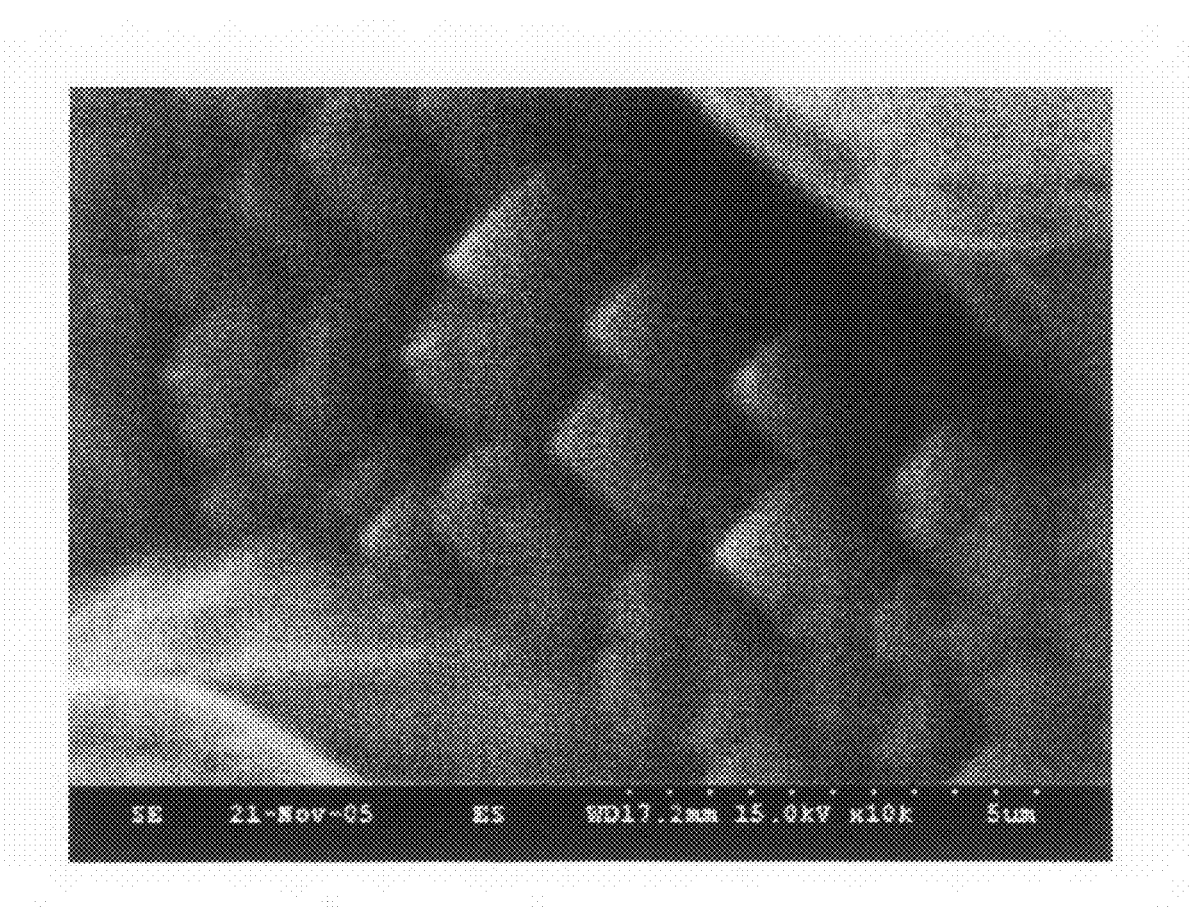
FIG. 1D is a plan view SEM (scanning electron microscope) image of a multilayer epitaxial structure of FIG. 1B.

The upper surface S2 of the multilayer epitaxial structure 101 on the semiconductor substrate 100 is roughened by dry or wet etching 108. For example, wet etching can be performed on the upper surface S2 of the multilayer epitaxial structure 101 using HCl and $H_3PO_4$ as an etchant for about 20 seconds. FIG. 1D is a top view of SEM (Scanning Electron Microscope) image of a multilayer epitaxial structure shown in FIG. 1B. The upper surface S2 of the multilayer epitaxial structure 101 comprises at least two different lattice planes, such as (100) and (001) lattice planes. The surface structure with different lattice planes may act as an etch mask, so an additional etch mask is not required. Since the etching rate of the (100) and (001) lattice planes are different, the multilayer epitaxial structure 101 may have an upper surface S3 having substantially the same surface topography as the original upper surface S2 thereof and the upper surface S1 of the semiconductor substrate 100 after etching, but the roughening degree of the upper surface S3 exceeds that of the original upper surface S2 and the upper surface S1. FIG. 1C is a magnified diagram showing the upper surface S3 of the multilayer epitaxial structure 101. In the embodiment, the roughened upper surface S3 of the multilayer epitaxial structure 101 has a roughening depth not less than 0.05 μm, and between 0.05 μm and 1 μm is preferred.

Upper and lower electrode plates 110 and 112 are respectively formed on the upper surface S3 of the multilayer epitaxial structure 101 and the lower surface of the semiconductor substrate 100 by conventional process steps. Note that the arrangement of the upper and lower electrode plates 110 and 112 can be varied with different device design.

Since the multilayer epitaxial structure 101 is formed by epitaxial growth along a predetermined lattice direction and then etching, the multilayer epitaxial structure 101 can have an upper surface with higher roughening degree and regular and even roughening topography. Accordingly, light extraction efficiency of the semiconductor light-emitting device is increased, thereby enhancing the light-emitting efficiency of the semiconductor light-emitting device.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor light-emitting device, comprising:
a semiconductor substrate having an upper surface with only one predetermined lattice direction perpendicular to the upper surface thereof, wherein the only one predetermined lattice direction is selected from a group consisting of oriented directions toward $[0\bar{1}1]$ with a first angle from [100], $[01\bar{1}]$ with the first angle from [100], [011] with a second angle from $[\bar{1}00]$, and $[0\bar{1}\bar{1}]$ with the second angle from $[\bar{1}00]$, wherein the first or the second angle is between 6° and 55°; and
a multilayer epitaxial structure disposed on the upper surface, wherein the multilayer epitaxial structure has a roughened upper surface substantially perpendicular to the only one predetermined lattice direction, wherein the upper surfaces of the multilayer epitaxial structure and the semiconductor substrate have substantially the same surface topography.

2. The device as claimed in claim 1, wherein the multilayer epitaxial structure comprises an n-type semiconductor layer, a p-type semiconductor layer and an active layer interposed therebetween.

3. The device as claimed in claim 1, wherein the first or the second angle is 15°.

4. The device as claimed in claim 1, wherein the roughened upper surface of the multilayer epitaxial structure has a roughening depth not less than 0.05 μm.

5. The device as claimed in claim 1, wherein the roughened upper surface of the multilayer epitaxial structure has a roughening depth between 0.05 μm and 1 μm.

6. The device as claimed in claim 1, wherein the lattice direction is defined by having a group III atom located at the [000] position of the coordinate of the unit cell as the origin.

* * * * *